(12) United States Patent
Lee

(10) Patent No.: US 6,855,604 B2
(45) Date of Patent: Feb. 15, 2005

(54) METHOD FOR FABRICATING METAL-OXIDE SEMICONDUCTOR TRANSISTOR

(75) Inventor: Sang-Don Lee, Ichon-shi (KR)

(73) Assignee: Hynix Semiconductor Inc., Ichon-shi (KR)

(*) Notice: Subject to any disclaimer, the term of this patent is extended or adjusted under 35 U.S.C. 154(b) by 23 days.

(21) Appl. No.: 10/617,683

(22) Filed: Jul. 14, 2003

(65) Prior Publication Data

US 2004/0126948 A1 Jul. 1, 2004

(30) Foreign Application Priority Data

Dec. 30, 2002 (KR) ................................ 10-2002-0086465

(51) Int. Cl.$^7$ ............................................. H01L 21/336
(52) U.S. Cl. ........................ 438/270; 438/589; 438/173; 438/268
(58) Field of Search ............................... 438/270, 589, 438/173, 268

(56) References Cited

U.S. PATENT DOCUMENTS 6,689,664 B2 * 2/2004 Park ........................... 438/282

OTHER PUBLICATIONS

Udo Schwalke, et al.; "Dual–Workfunction Gate Engineering in a Corner Parasitics–Free Shallow–Trench–Isolation Complementary–Metal–Oxide–Semiconductor Technology"; Jpn. J. Appl. Phys. vol. 38; 1999; pp. 2232–2237.

* cited by examiner

Primary Examiner—Luan Thai
(74) Attorney, Agent, or Firm—Piper Rudnick LLP

(57) ABSTRACT

The present invention relates to a method for fabricating a metal-oxide semiconductor (MOS) transistor having a gate electrode with a stack structure of a polysilicon layer, a tungsten nitride barrier layer and a tungsten layer. According to the present invention, a depth from a lastly deposited nitride layer to a bottom surface of a trench is shallower, and thereby decreasing incidences of a void generation. Also, the present invention provides an advantage of an elaborate manipulation of well and channel dopings by performing ion-implantations with two different approaches. Furthermore, it is possible to enhance device characteristics by decreasing gate induced drain leakage (GIDL) currents and improving a capability of driving currents. This decrease of the GIDL currents and the improved driving current capability are obtained by forming the gate oxide layer with different thicknesses.

18 Claims, 10 Drawing Sheets

METHOD FOR FABRICATING METAL-OXIDE SEMICONDUCTOR TRANSISTOR

FIELD OF THE INVENTION

The present invention relates to a method for fabricating a metal-oxide semiconductor (MOS) transistor; and, more particularly, to a method for fabricating a MOS transistor having a gate electrode with a stack structure of a polysilicon layer, a tungsten nitride barrier layer and a tungsten layer.

DESCRIPTION OF RELATED ARTS

With reference to FIGS. 1A to 1E, a conventional method for fabricating a transistor according to an extigate technology will be described in the following.

Referring to FIG. 1A, a gate oxide layer 2 is formed and grown in a substrate 1, and a polysilicon layer 3 for a gate electrode, an interfacial oxide layer 4 and a first nitride layer 5 are sequentially formed thereon. Hereinafter, the polysilicon layer 3 for the gate electrode is referred to as a gate polysilicon layer. A photosensitive pattern (not shown) for forming a predetermined device isolation layer 6 is formed on the first nitride layer 5. The first nitride layer 5, the interfacial oxide layer 4, the gate polysilicon layer 3 and the gate oxide layer 2 are sequentially etched with use of the photoresist pattern. A portion of the substrate 1 exposed by the above etch process is etched to a predetermined depth to form a trench in a device isolation region. Thereafter, the photosensitive pattern is removed.

Referring to FIG. 1B, the device isolation oxide layer 6 is deposited on an entire surface of the substrate 1 in such a manner to be filled into the trench, and then, a chemical mechanical polishing (CMP) process is performed until the first nitride layer 5 is exposed. Prior to depositing the device isolation oxide layer 6, a thermal oxide layer can be deposited on lateral sides and a bottom side of the etched portion of the substrate 1 and lateral sides of the exposed gate polysilicon layer 3. At this time, the thermal oxide layer has a thickness below about 10 nm.

As shown in FIG. 1C, the exposed first nitride layer 5 is proceeded with a wet-type etch process. Then, a p-type impurity is selectively ion-implanted to a p-type well region by using a predetermined mask for forming a p-type well 7 (hereinafter referred to as a p-type well mask). In the mean time, an n-type impurity is selectively ion-implanted to an n-type well region by using a predetermined mask for forming an n-type well 8 (hereinafter referred to as an n-type well mask). After these ion-implantations, a heat treatment is carried out to thereby form the p-type well 7 and the n-type well 8.

Referring to FIG. 1D, a wet-type etch process is subjected to the interfacial oxide layer 4 and an upper part of the device isolation layer 6. A tungsten nitride (WN) barrier layer 9 and a tungsten (W) layer 10 for forming a gate electrode (hereinafter referred to as a gate tungsten layer) are sequentially deposited on the above entire structure, and a second nitride layer 11 is deposited thereon.

With reference to FIG. 1E, a predetermined photosensitive pattern (not shown) for forming a gate electrode is formed on the second nitride layer 11. Herein, the photosensitive pattern for forming the gate electrode is referred to as gate electrode photosensitive pattern. The second nitride layer 11, the gate W layer 10, the WN barrier layer 9 and the gate polysilicon layer 3 are sequentially etched with use of the gate electrode photosensitive pattern to thereby form the gate electrode.

After the gate electrode is formed, the gate electrode photosensitive pattern is removed. A selective oxidation process is proceeded to form and grow a selective oxide layer 12 on a lateral portion of the gate polysilicon layer 3 and an exposed portion of the gate oxide layer 2. Thereafter, a nitride layer is deposited on an entire surface of the resulting structure and then etched so that a gate lateral nitride layer 13 is formed. Subsequent processes after the above process are identical to those processes for fabricating a typical metal-oxide semiconductor field effect transistor (MOSFET).

FIG. 2 is a cross-sectional view of the FIG. 1 in a vertical direction. The gate electrode formed at the transistor region has a stack structure of the gate polysilicon layer 3, the WN barrier layer 9 and the gate W layer 10. On the other hand, the gate electrode formed at the device isolation region has a structure including the WN barrier layer 9 and the gate electrode W layer 10.

As mentioned above, the thermal oxide layer can be formed at the lateral sides and bottom side of the etched substrate structure, i.e., the gate oxide layer 2, and lateral sides of the exposed gate polysilicon layer 3 according to the conventional method for forming the gate electrode. However, it is noted that a bird's beak effect occurs at an interface between the exposed gate polysilicon layer 3, the gate oxide layer 2 and the etched substrate. That is, the thickness of the thermal oxide layer becomes thicker around the exposed substrate 1. Also, a void generation can easily occur during the deposition of the device isolation layer because a depth from the lastly deposited nitride layer to the bottom side of the trench is too deep. In other words, the depth is the total thickness of the gate oxide layer 2, the gate polysilicon layer 3, the interfacial oxide layer 4, the first nitride layer 5 and the etched substrate.

SUMMARY OF THE INVENTION

It is, therefore, an object of the present invention to provide a method for fabricating a metal-oxide semiconductor (MOS) transistor capable of manipulating elaborately a well and a channel dopings, improving a short channel effect and enhancing device characteristics by decreasing a gate induced drain leakage (GIDL) current.

In accordance with an aspect of the present invention, there is provided a method for fabricating a metal-oxide semiconductor (MOS) transistor, including the steps of: (a) forming sequentially a first oxide layer and a first nitride layer on a substrate; (b) forming a device isolation layer filled in a first trench formed by selectively etching the first oxide layer, the first nitride layer and a first portion of the substrate; (c) forming a second trench defining a channel region therebeneath by selectively etching the first oxide layer, the first nitride layer and a second portion of the substrate; (d) forming a gate oxide layer on lateral sides and a bottom side of the second trench; and (e) forming a gate electrode on the gate oxide layer.

In accordance with another aspect of the present invention, there is also provided a method for fabricating a metal-oxide semiconductor (MOS) transistor, including the steps of: forming sequentially a first oxide layer and a first nitride layer on a substrate; etching selectively the first nitride layer and the first oxide layer to expose a portion of the substrate; etching the exposed portion of the substrate with a predetermined thickness to form a first trench at a device isolation region; depositing a device isolation oxide layer on an entire surface of the substrate in such a manner that the device isolation layer is filled into the first trench;

performing a chemical mechanical polishing (CMP) process until the first nitride layer is exposed; etching selectively the first nitride layer except for the exposed portion of the first nitride layer and the first oxide layer with use of a mask pattern for forming a predetermined gate electrode; etching an exposed portion of the substrate with a predetermined thickness to form a second trench defining a channel region and clean the trench; forming a buffer oxide layer on the substrate; performing a channel ion-implantation technique to the second trench defining the channel region; removing the first nitride layer and the buffer oxide layer and growing a gate oxide layer on lateral sides and a bottom side of the exposed portion of the substrate; depositing a polysilicon layer for forming a gate electrode on an entire surface of the substrate; performing a CMP process to the polysilicon layer for forming the gate electrode until the device isolation oxide layer is exposed; depositing a tungsten nitride barrier layer, a tungsten layer for forming a gate electrode and a second nitride layer on an entire surface of the substrate; patterning the second nitride layer, the tungsten layer for forming the gate electrode and the tungsten nitride barrier layer into a predetermined gate electrode pattern; forming a lateral nitride layer at lateral sides of the patterned tungsten nitride barrier layer and the tungsten layer for forming the gate electrode; and performing a selective oxidation process to form and grow a selective oxide layer on the polysilicon layer for forming the gate electrode encompassed by the substrate and the lateral nitride layer in order to recover any damage generated by the etch process.

BRIEF DESCRIPTION OF THE DRAWING(S)

The above and other objects and features of the present invention will become apparent from the following description of the preferred embodiments given in conjunction with the accompanying drawings, in which.

DETAILED DESCRIPTION OF THE INVENTION

Hereinafter, a method for fabricating a metal-oxide semiconductor (MOS) transistor will be described in more detail with reference to the drawings.

Figure 1A:
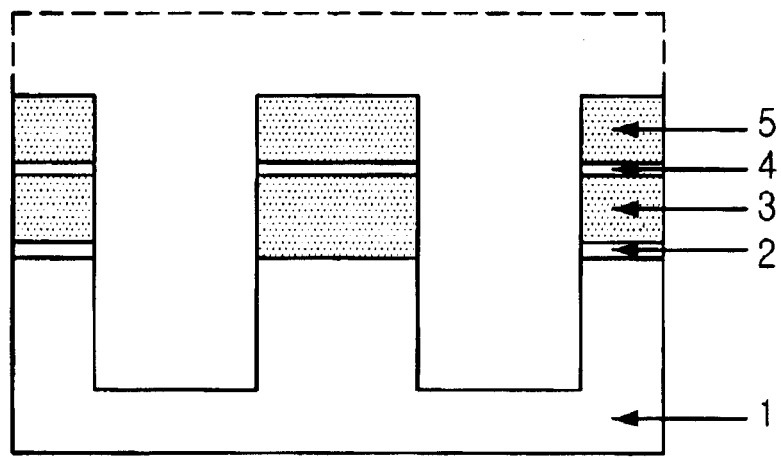
FIGS. 1A to 1E are cross-sectional views showing a conventional method for fabricating a metal-oxide semiconductor (MOS) transistor.
Figure 1B:
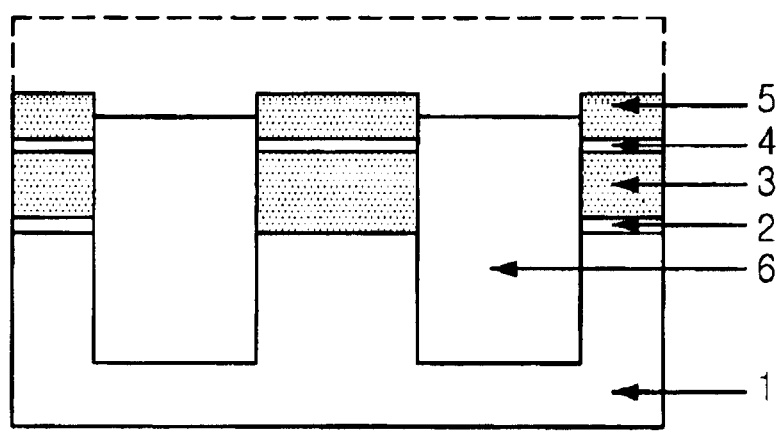
Figure 1C:
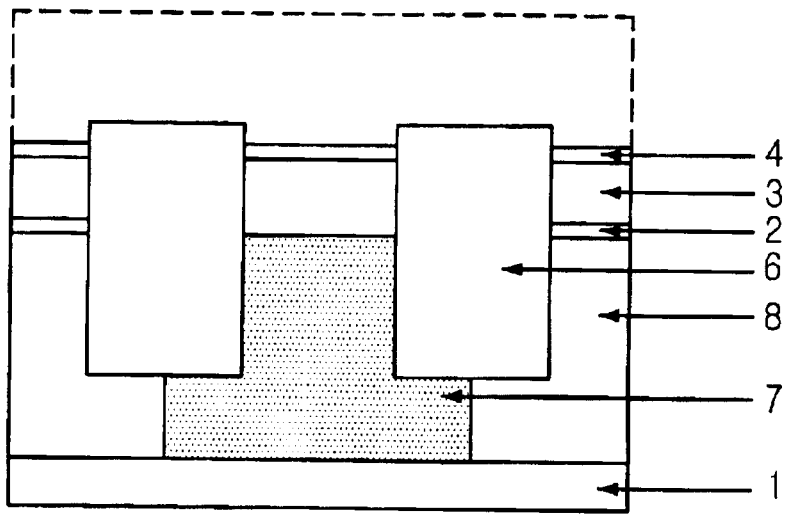
Figure 1D:
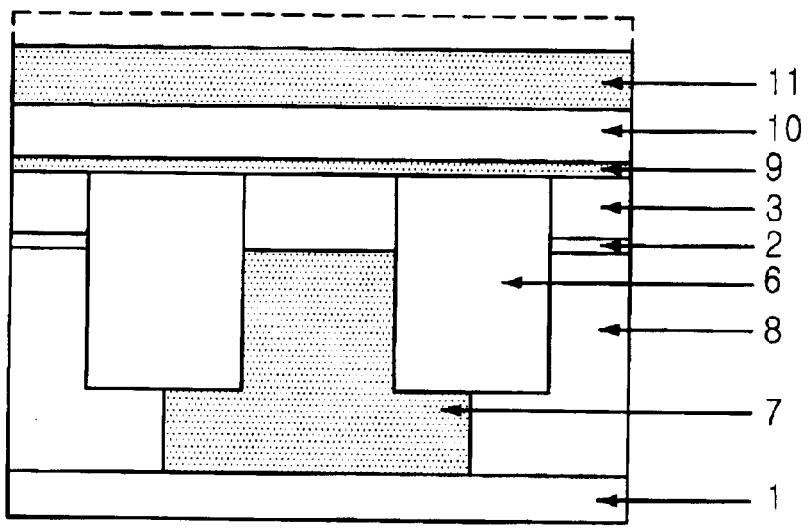
Figure 1E:
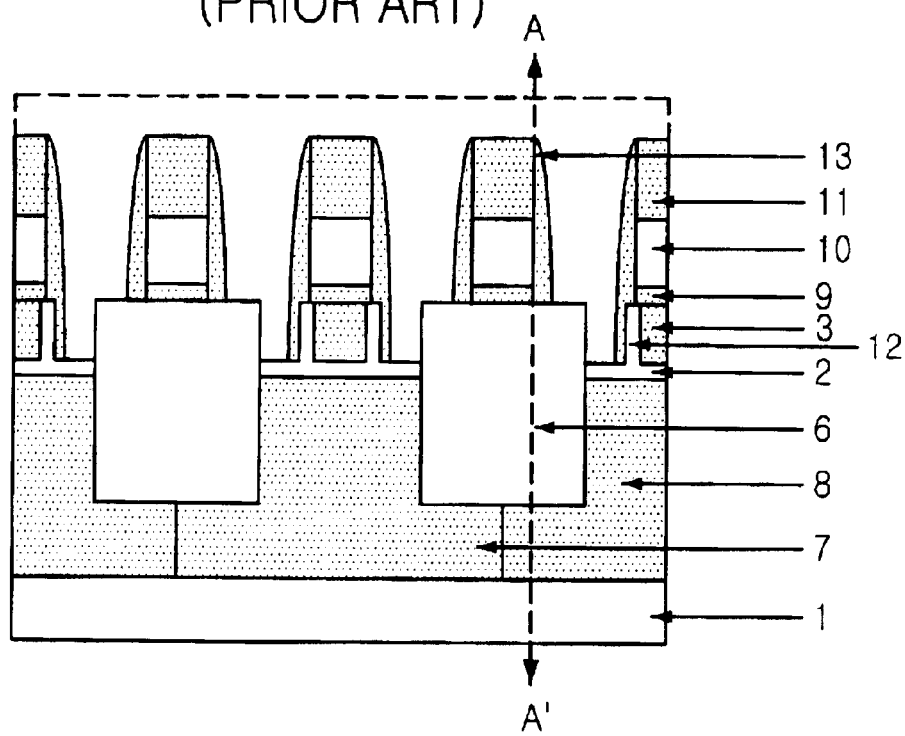
Figure 2:
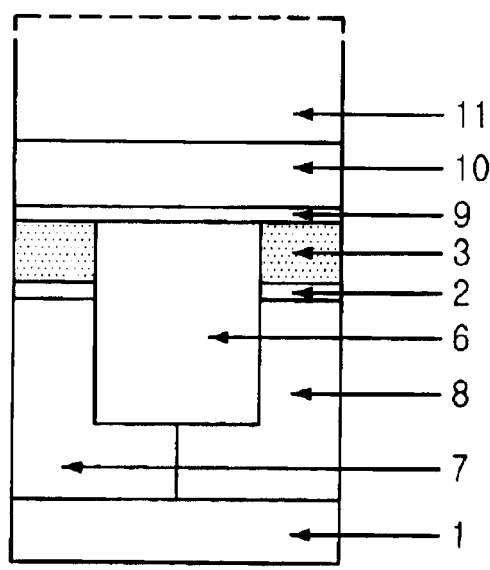
FIG. 2 is a cross-sectional view taking a line A-A' of the MOS transistor shown in FIG. 1E.
Figure 3A:
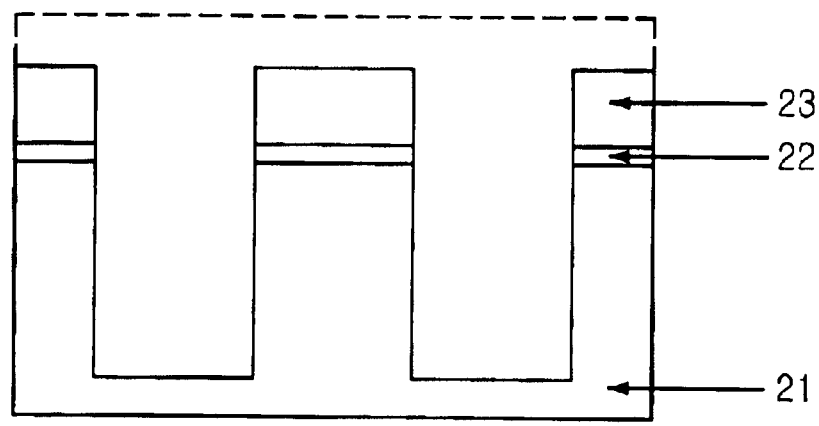
FIGS. 3A to 3H are cross-sectional views showing a method for fabricating a MOS transistor in accordance with a first preferred embodiment of the present invention.

Referring to FIG. 3A, a first oxide layer 22 is grown on a substrate 21, and a first nitride layer 23 is formed thereon. Afterwards, the first nitride layer 23 and the first oxide layer 22 are selectively etched with use of a predetermined mask (not shown) for forming a device isolation layer, and a portion of the substrate 21 exposed by the above selective etch process is etched to a predetermined depth to thereby form a first trench at a device isolation region. The first oxide layer 22 has a thickness ranging from about 5 nm to about 20 nm, and the first nitride layer 23 has a thickness ranging from about 50 nm to about 150 nm. It is preferable to form the first trench with a thickness ranging from about 150 nm to about 400 nm.

Figure 3B:
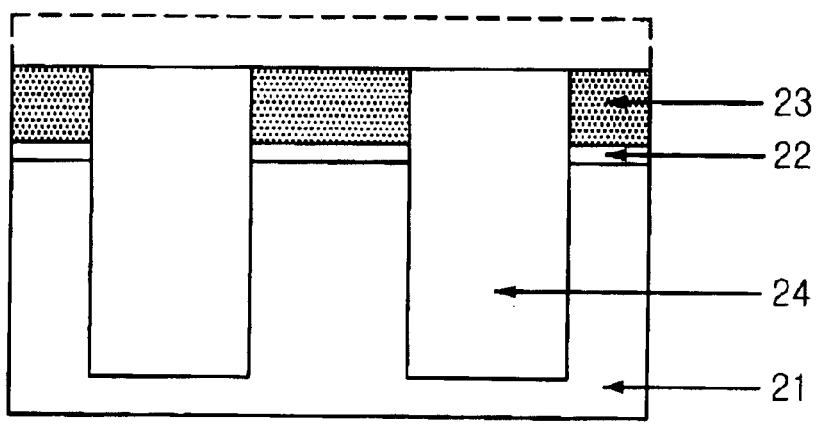

Referring to FIG. 3B, a device isolation oxide layer 24 is formed on an entire surface of the substrate 21 in such a manner to be filled into the first trench. A chemical mechanical polishing (CMP) process is performed until the first nitride layer 23 is exposed. Herein, compared to the conventional method, the device isolation oxide layer 24 can be easily filled into the trench since a height of the trench is lower than that of the conventional trench. Prior to depositing the device isolation layer 24 into the trench, it is possible to form and grow a sacrificial oxide layer or a thermal oxide layer at lateral sides and a bottom side of the first trench and to etch the grown sacrificial oxide layer or thermal oxide layer.

A p-type impurity is selectively ion-implanted to a p-type well region with use of a predetermined mask for forming a p-type well 25. Then, an n-type impurity is selectively ion-implanted to an n-type well region with use of a predetermined mask for forming an n-type well 26. The ion-implantations for forming the p-type well 25 and the n-type well 26 are performed preferably with several separate applications of energy in a range from about 3 MeV to about 40 KeV.

Figure 3C:
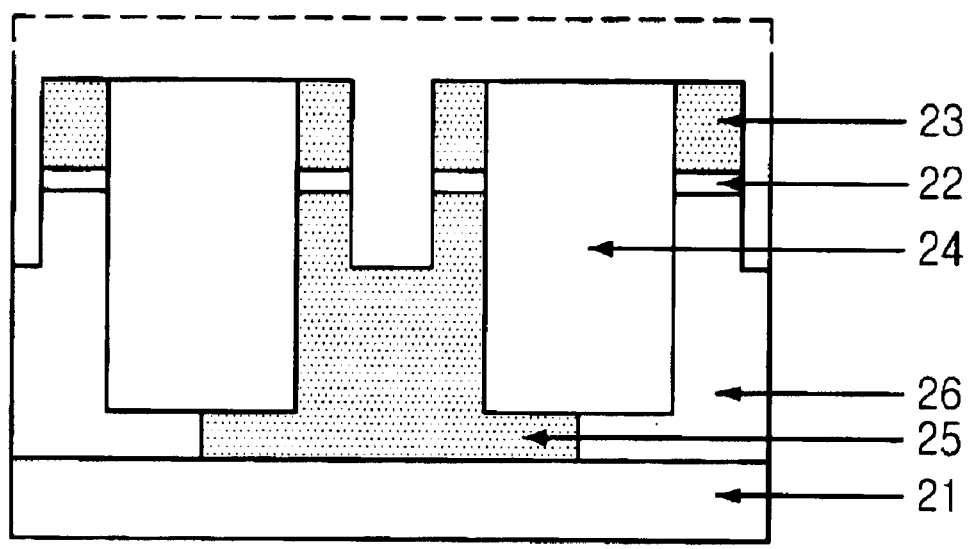

Next, referring to FIG. 3C, a non-exposed portion of the first nitride layer 23 and the first oxide layer 22 are selectively etched with use of a predetermined mask pattern (not shown) for forming a gate electrode. At this time, the exposed portion of the first nitride layer 23 is excluded from this selective etching. Afterwards, a portion of the substrate 21 exposed by this selective etching is etched to a predetermined depth to thereby form a second trench in which a channel region will be formed. A cleaning process is then performed thereto.

Figure 3D:
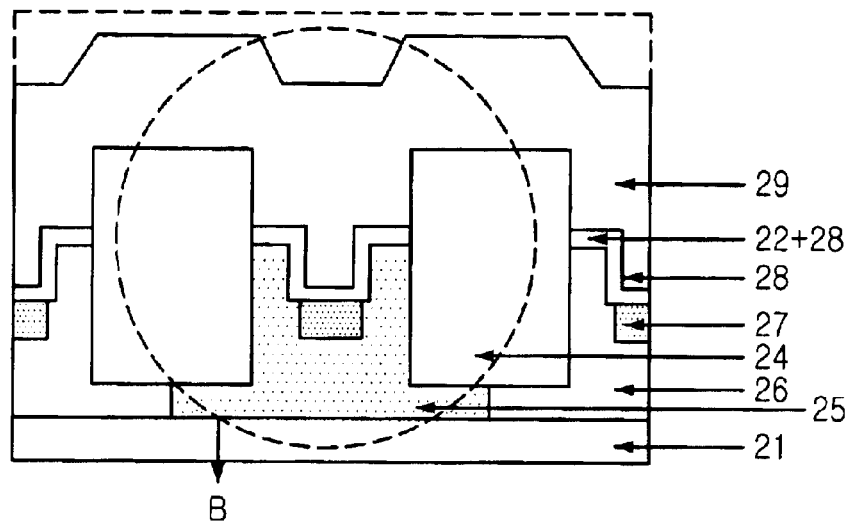

Referring to FIG. 3D, a buffer oxide layer (not shown) is formed and grown on the substrate 21. Preferably, the buffer oxide layer has a thickness ranging from about 5 to about 10 nm. A channel region 27 is formed beneath a bottom side of the second trench by performing a channel ion-implantation technique with use of a channel mask of a MOS transistor. At this time, the channel ion-implantation is carried out with energy ranging from about 1 KeV to about 100 KeV. Subsequent to the channel region 27 formation, the first nitride layer 23 and the buffer oxide layer are removed, and a gate oxide layer 28 is grown thereafter. Also, the gate oxide layer 28 is preferably formed in a thickness ranging from about 3 nm to about 10 nm.

Next, a polysilicon layer 29 for forming the gate electrode (hereinafter referred to as a gate polysilicon layer) is deposited to a thickness ranging from about 50 nm to about 400 nm. Since lateral sides of the etched portion of the substrate 21 for forming the gate electrode has a crystal direction of 110, the gate oxide layer 28 formed at these lateral sides is grown to a thickness greater than above about 50% of that of the gate oxide layer 28 formed at a bottom side of the etched portion of the substrate 21 having a crystal direction of 100. Also, despite that the gate oxide layer 28 is formed at the lateral sides and the bottom side of the etched portion of the substrate 21, a thickness of the gate oxide layer 28 is actually thinner at the channel region 27. The reason for this result is because the gate oxide layer 28 and the first oxide layer 22 are formed on the substrate 21. Herein, together the gate oxide layer 28 and the first oxide layer 22 formed on the substrate 21 will be referred to as thick oxide layer. Also, this thinly formed gate oxide layer 28 at the channel region becomes a factor for increasing a capability of driving currents. Furthermore, since the thick oxide layer 22+28 exists at a region overlapped with a source/drain region, an overlap capacitance between the gate electrode and the source/drain and a gate induced drain leakage (GIDL) current decrease.

Figure 3E:
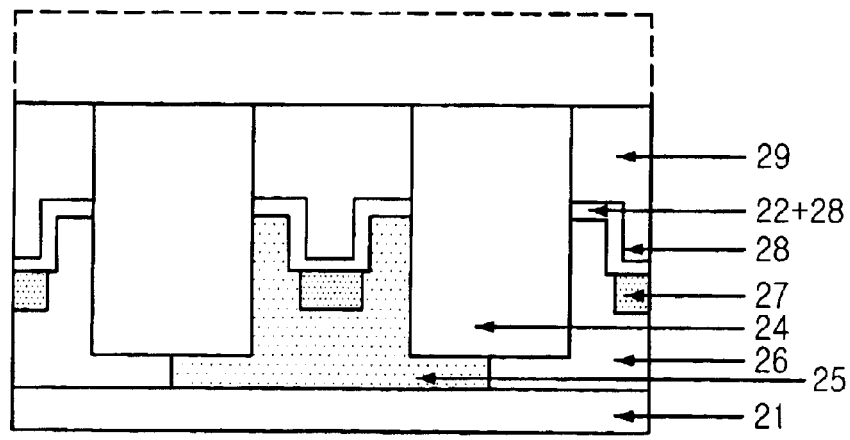

Referring to FIG. 3E, a CMP process is performed to the gate polysilicon layer 29 until a surface of the device isolation oxide layer 24 is exposed. At this time, the gate electrode silicon layer 29 has a thickness ranging from about 30 to about 130 nm.

Figure 3F:
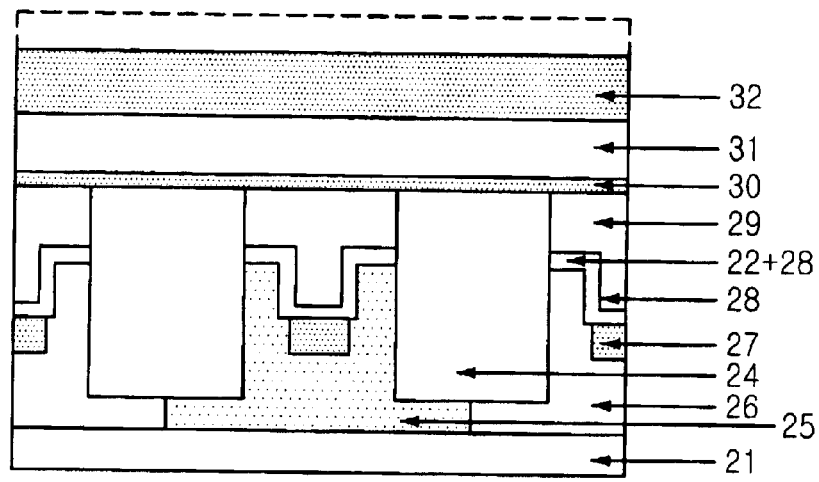

As shown in FIG. 3F, a tungsten nitride (WN) barrier layer 30 and a tungsten (W) layer 31 for forming the gate electrode (hereinafter referred to as a gate W layer) are sequentially deposited on the above entire substrate 21. Then, a second nitride layer 32 is formed on the gate W layer 31. The WN barrier layer 30 has a thickness ranging from about 3 to 10 nm. On the other hand, the gate W layer has a thickness ranging from about 50 to about 150 nm. It is also preferable to form the second nitride layer 32 with a thickness ranging from about 150 nm to about 400 nm. It is also possible to use such materials as TiN, WSiN, TiSiN or $WSi_x$ instead of using the WN for the barrier layer.

Figure 3G:
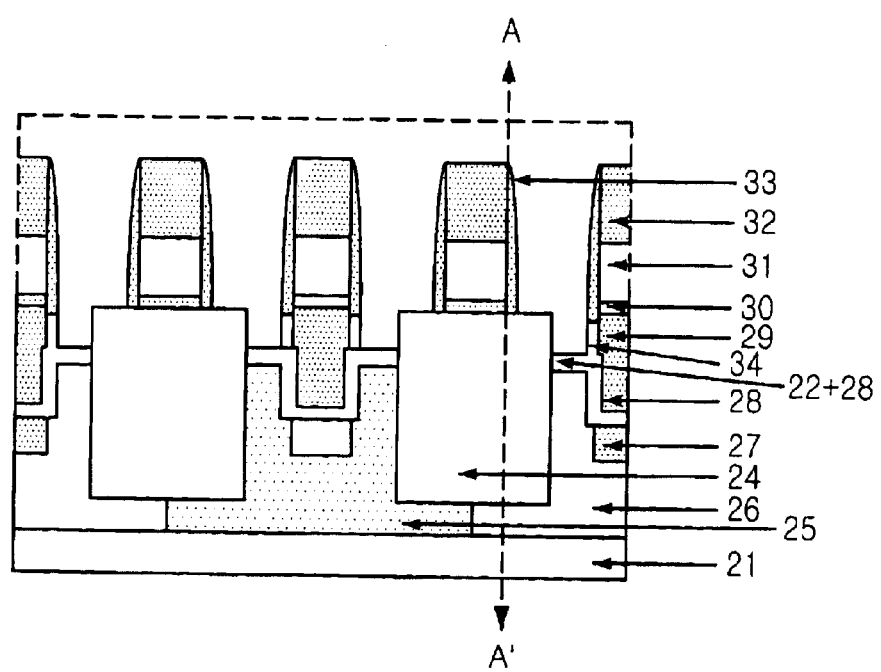

Referring to FIG. 3G, the second nitride layer 32, the gate W layer 31 and the WN barrier layer 30 are sequentially etched with use of a predetermined gate electrode mask pattern (not shown). On an entire surface of the substrate 21, a third nitride layer is deposited and etched to form a first lateral nitride layer 33 at lateral sides of the WN barrier layer 30 and the gate W layer 31. At this time, a thickness of the first lateral nitride layer 33 is thin preferably in a range from about 3 to about 40 nm. The exposed gate electrode polysilicon layer 29 is etched, and a selective oxidation process is subsequently performed to form and grow a selective oxidation layer 34 grown only at a substrate portion of the gate electrode region through exposed lateral sides of the gate polysilicon layer 29 and the thick oxide layer 22+28. Preferably, a thickness of the selective oxidation layer 34 ranges from about 1.5 nm to about 10 nm.

Figure 3H:
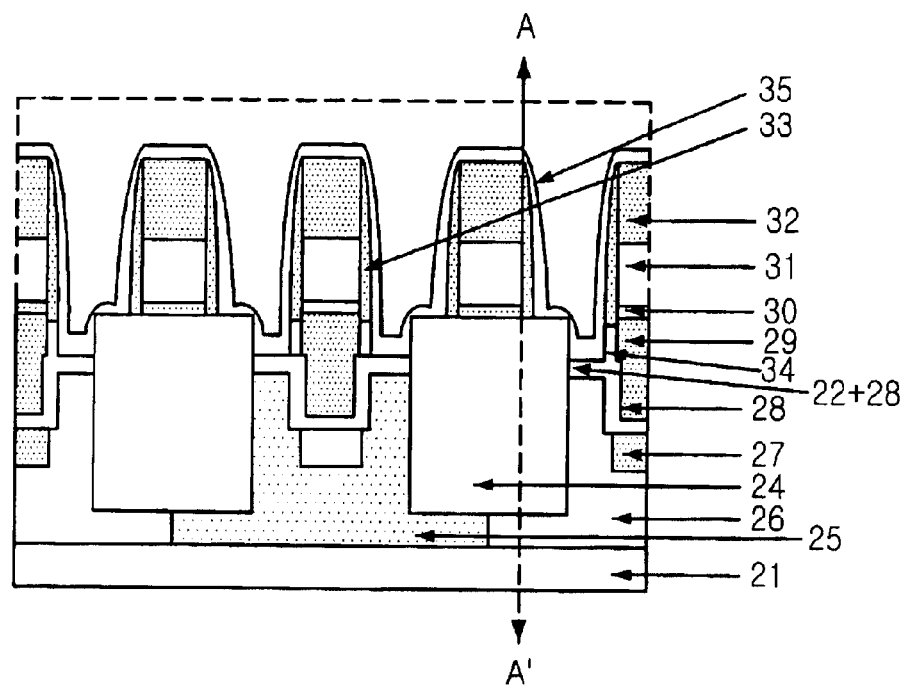

Referring to FIG. 3H, a forth nitride layer 35 for preventing losses of the selective oxidation layer 34 is formed on an entire surface of the resulting structure shown in FIG. 3G. At this time, the forth nitride layer 35 is formed to a thickness ranging from about 5 nm to about 40 nm. Afterwards, the identical processes for fabricating the typical MOSFET are carried out to complete the MOS transistor fabrication.

Figure 4:
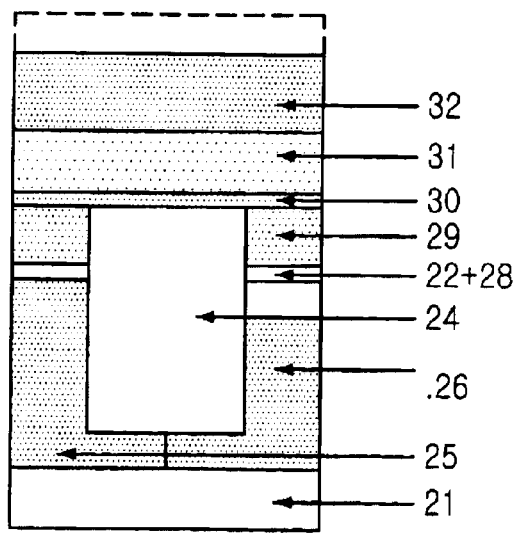
FIG. 4 is a cross-sectional view taking the line A-A' of the MOS transistor shown in FIG. 3H.

FIG. 4 is a cross-sectional view taking the line A-A' of the MOS transistor shown in FIG. 3H. The gate electrode formed at the transistor region has a stack structure of the gate polysilicon layer 29, the WN barrier layer 30, and the W layer 31. On the other hand, the gate electrode formed at the device isolation region has the same stack structure excluding the gate polysilicon layer 29.

Figure 5:
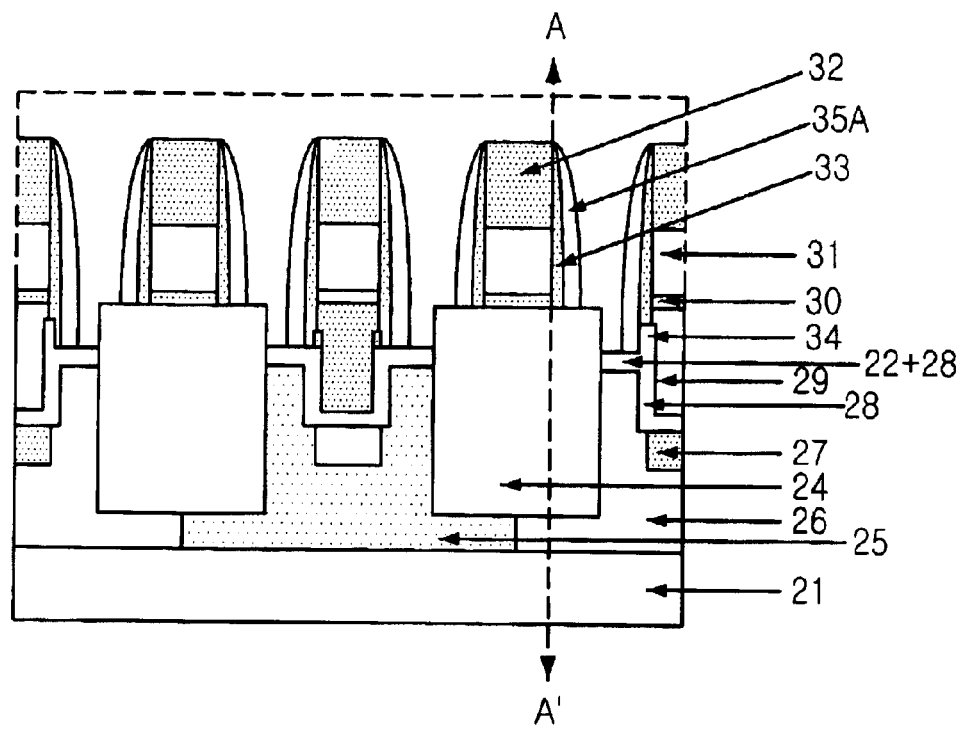
FIG. 5 is a cross-sectional view showing a method for fabricating a MOS transistor in accordance with a second preferred embodiment of the present invention.

FIG. 5 is a cross-sectional view showing a method for fabricating a MOS transistor in accordance with a second preferred embodiment of the present invention. The same processes shown in FIGS. 3A to 3G are employed. Afterwards, a forth nitride layer 35 for preventing losses of the selective oxide layer 34 is deposited in a thin thickness and is then etched to form a second lateral nitride layer 35A. Subsequent to the second gate nitride layer 35A formation, the same processes for fabricating the typical MOSFET transistor are performed.

Figure 6:
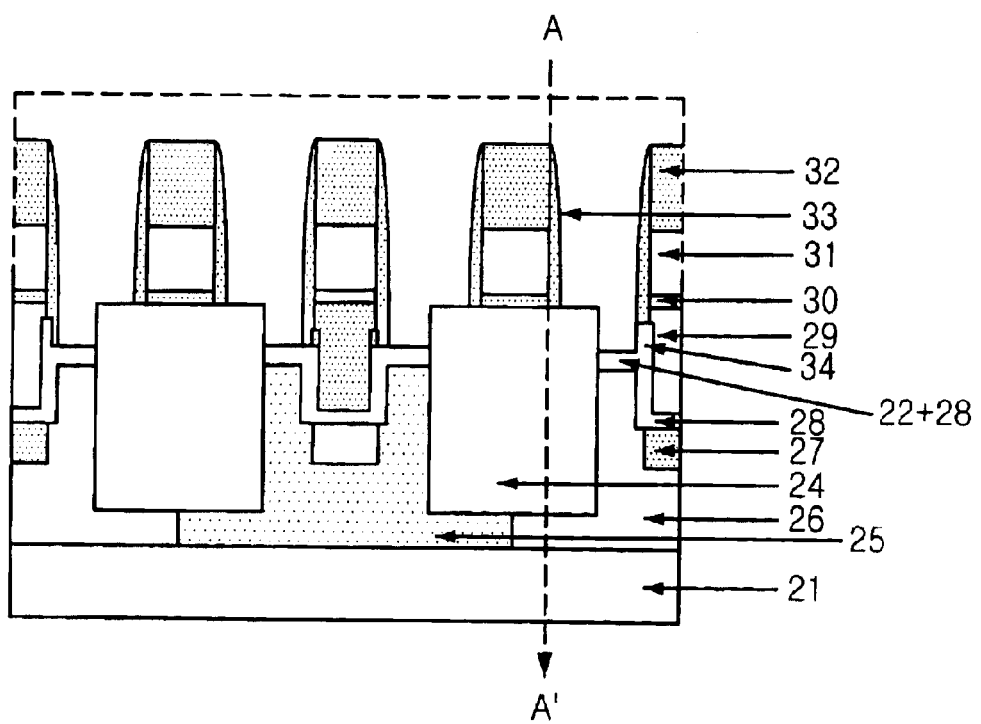
FIG. 6 is a cross-sectional view showing a method for fabricating a MOS transistor in accordance with a third embodiment of the present invention.

FIG. 6 is a cross-sectional view showing a method for fabricating a MOSFET transistor in accordance with a third preferred embodiment of the present invention. The same processes illustrated in FIGS. 3A to 3F are employed. Afterwards, the second nitride layer 32, the gate W layer 31, the WN layer 30 and the gate polysilicon layer 29 are sequentially etched by using a predetermined gate electrode mask pattern (not shown). A third nitride layer is deposited and etched to form a first lateral nitride layer 33 with a thin thickness at lateral sides of the WN barrier layer 30 and the gate W layer 31. Next, a selective oxidation process is performed to form a selective oxide layer 34 and make it grown through an exposed portion of the gate oxide layer 28 in order to recover damages generated during the above etch process. The same process described in FIG. 3H or FIG. 5 is employed. Afterwards, the typical MOSFET transistor fabrication processes are carrier out, thereby completing the MOS transistor fabrication.

Figure 7:
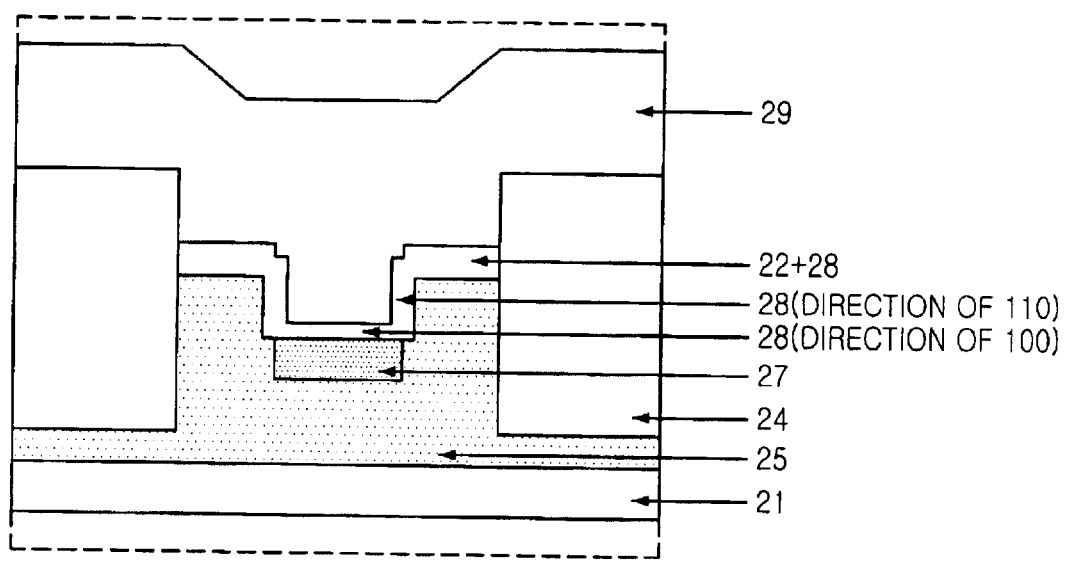
FIG. 7 is an enlarged cross-sectional view of a marked part 'B' shown in FIG. 3D.

FIG. 7 is an enlarged cross-sectional view of a remarked part 'A' in FIG. 3D. When the gate oxide layer 28 is grown, the first oxide layer 22 gets remained on a non-etched portion of the substrate 21. As a result, an actual thickness of the gate oxide layer 28 formed at the non-etched portion of the substrate 21 is the sum of the thickness of the gate oxide layer 28 and that of the remaining first oxide layer 22. Therefore, this oxide layer 22+28 at the non-etched portion of the substrate 21 is thicker than the gate oxide layer 28 formed at the lateral sides and the bottom side of the trench. Hereinafter, this oxide layer 22+28 is referred to as a thick oxide layer. Also, since lateral sides of an etched portion of the substrate 21 have a crystal direction of 110, the thickness of the gate oxide layer 28 increases about 50% higher than that of the gate oxide layer 28 formed at the bottom side of the substrate 21 having a crystal direction of 100. The channel of the transistor is actually formed only at the bottom side of the etched portion of the substrate 21. At this bottom side, the thickness of the gate oxide layer 28 is the thinnest, and thereby increasing a capability of driving currents. Furthermore, the thick oxide layer 22+28 exists at the rest regions in which the gate electrode and the source/drain are overlapped, i.e., the regions excluding the channel region. Therefore, an overlap capacitance between the gate and the source/drain and a gate induced drain leakage (GIDL) current decrease.

In accordance with the present invention, it is possible to decrease a void, generated when a trench-type device isolation oxide layer is deposited through the use of a typical extigate technology, by which the gate polysilicon layer and the nitride layer are deposited without any intermediate oxide layer and are subjected to a trench process with a purpose of providing a shallow depth from the lastly deposited nitride layer to the bottom surface of the trench.

Also, an ion-implantation for forming the n-type or p-type well is performed in the presence of the nitride layer, and a channel ion-implantation is performed after the trench defining the channel region 27 is formed by etching the substrate. These different approaches of the ion-implantations make it possible to manipulate elaborately the well and the channel dopings. Furthermore, a length of the channel can be increased under the same design rule by forming the trench through the etching of the substrate, and this fact results in an improvement on a short channel effect and a reinforcement of a step-coverage in the gate electrode having a structure of W/WN/polysilicon.

In addition, the capability of driving currents can be also improved by forming the gate oxide layer with a thin thickness at the bottom side of the etched portion of the substrate beneath which the channel region is formed. An overlap capacitance between the gate electrode and the source/drain and the GIDL current can also be reduced by forming the thick oxide layer at the rest regions where the gate electrode and the source/drain are overlapped.

While the present invention has been described with respect to certain preferred embodiments, it will be apparent to those skilled in the art that various changes and modifications may be made without departing from the scope of the invention as defined in the following claims.

What is claimed is:

1. A method for fabricating a metal-oxide semiconductor (MOS) transistor, comprising the steps of:
    (a) forming sequentially a first oxide layer and a first nitride layer on a substrate;
    (b) forming a device isolation layer filled in a first trench formed by selectively etching the first oxide layer, the first nitride layer and a first portion of the substrate;
    (c) forming a second trench defining a channel region therebeneath by selectively etching the first oxide layer, the first nitride layer and a second portion of the substrate;
    (d) forming a gate oxide layer on lateral sides and a bottom side of the second trench; and
    (e) forming a gate electrode on the gate oxide layer.

2. The method as recited in claim 1, wherein the step (e) includes the steps of:
    (e1) depositing a polysilicon layer for forming a gate electrode on an entire surface of the substrate;
    (e2) performing a CMP process to the polysilicon layer for forming the gate electrode until the device isolation oxide layer is exposed;
    (e3) depositing a tungsten nitride barrier layer, a tungsten layer for forming a gate electrode and a second nitride layer on an entire surface of the substrate;
    (e4) patterning the second nitride layer, the tungsten layer for forming the gate electrode and the tungsten nitride barrier layer into a predetermined gate electrode pattern;
    (e5) forming a lateral nitride layer at lateral sides of the patterned tungsten nitride barrier layer and the tungsten layer for forming the gate electrode with a thin thickness; and
    (e6) etching an exposed portion of the polysilicon layer for forming the gate electrode and performing a selective oxidation process thereto so that a selective oxide layer is grown only at a portion of the substrate and lateral sides of the exposed polysilicon layer not being buried in the second trench.

3. The method as recited in claim 2, wherein the polysilicon for forming the gate electrode is formed in a thick thickness ranging from about 50 nm to about 400 nm.

4. The method as recited in claim 2, wherein the tungsten nitride barrier layer, the tungsten layer for forming the gate electrode and the second nitride layer have a thickness in a range from about 3 nm to about 10 nm, in a range from about 50 nm to about 150 nm and in a range from about 150 nm to about 400 nm, respectively.

5. The method as recited in claim 2, wherein the barrier layer can use TiN, WSiN, TiSiN or $WSi_x$ instead of using WN.

6. The method as recited in claim 2, wherein the lateral nitride layer has a thickness ranging from about 3 nm to about 40 nm.

7. The method as recited in claim 2, wherein the selective oxide layer has a thickness ranging from about 1.5 nm to about 10 nm.

8. The method as recited in claim 2, further comprising the step of depositing a nitride layer on an entire surface of the substrate and the gate electrode after growing the selective oxide layer in order to prevent losses of the selective oxide layer formed at lateral sides of the exposed portion of the polysilicon layer for forming the gate electrode.

9. The method as recited in claim 8, wherein the nitride layer has a thickness ranging from about 5 nm to about 40 nm.

10. The method as recited in claim 2, after the step (e6), further including the step of forming a lateral nitride layer by depositing a nitride layer with a thin thickness and subsequently etching the nitride layer so that the selective oxide layer can be protected from any damage or loss.

11. The method as recited in claim 1, after the step (c), further comprising the steps of:
    (c1) forming a buffer oxide layer on the substrate;
    (c2) performing a channel ion-implantation technique to the second trench for defining the channel region; and
    (c3) removing the first nitride layer and the buffer oxide layer.

12. The method as recited in claim 11, wherein the channel ion-implantation technique is performed with energy ranging from about 1 KeV to about 100 KeV.

13. The method as recited in claim 1, wherein the first oxide layer has a thickness ranging from about 5 nm to about 20 nm and the first nitride layer has a thickness ranging from about 50 nm to about 150 nm.

14. The method as recited in claim 1, wherein the first trench is formed with a depth in a range from about 150 nm to about 400 nm.

15. The method as recited in claim 1, further comprising the step of forming a sacrificial oxide layer or a thermal oxide layer at lateral sides and a bottom side of the trench prior to the formation of the device isolation oxide layer and etching the sacrificial oxide layer or the thermal oxide layer.

16. The method as recited in claim 1, further comprising the step of forming a p-type well and an n-type well at each predetermined region after forming the device isolation oxide layer.

17. The method as recited in claim 1, wherein the gate oxide layer has a thickness ranging from about 3 nm to about 10 nm.

18. A method for fabricating a metal-oxide semiconductor (MOS) transistor, comprising the steps of:
    forming sequentially a first oxide layer and a first nitride layer on a substrate;
    etching selectively the first nitride layer and the first oxide layer to expose a portion of the substrate;
    etching the exposed portion of the substrate with a predetermined thickness to form a first trench at a device isolation region;
    depositing a device isolation oxide layer on an entire surface of the substrate in such a manner that the device isolation layer is filled into the first trench;
    performing a chemical mechanical polishing (CMP) process until the first nitride layer is exposed;
    etching selectively the first nitride layer except for the exposed portion of the first nitride layer and the first oxide layer with use of a mask pattern for forming a predetermined gate electrode;
    etching an exposed portion of the substrate with a predetermined thickness to form a second trench defining a channel region and clean the trench;
    forming a buffer oxide layer on the substrate;

performing a channel ion-implantation technique to the second trench defining the channel region;

removing the first nitride layer and the buffer oxide layer and growing a gate oxide layer on lateral sides and a bottom side of the exposed portion of the substrate;

depositing a polysilicon layer for forming a gate electrode on an entire surface of the substrate;

performing a CMP process to the polysilicon layer for forming the gate electrode until the device isolation oxide layer is exposed;

depositing a tungsten nitride barrier layer, a tungsten layer for forming a gate electrode and a second nitride layer on an entire surface of the substrate;

patterning the second nitride layer, the tungsten layer for forming the gate electrode and the tungsten nitride barrier layer into a predetermined gate electrode pattern;

forming a lateral nitride layer at lateral sides of the patterned tungsten nitride barrier layer and the tungsten layer for forming the gate electrode; and performing a selective oxidation process to form and grow a selective oxide layer on the polysilicon layer for forming the gate electrode encompassed by the substrate and the lateral nitride layer in order to recover any damage generated by the etch process.

* * * * *